United States Patent
Lin (10) Patent No.: US 6,511,881 B1
(45) Date of Patent: Jan. 28, 2003

(54) METHOD FOR FABRICATING SPLIT GATE FLASH MEMORY CELL

(75) Inventor: Chi-Hui Lin, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/191,722

(22) Filed: Jul. 8, 2002

(30) Foreign Application Priority Data

Dec. 31, 2001 (TW) .......................... 90133120 A (51) Int. Cl.⁷ .......................... H01L 21/336
(52) U.S. Cl. .......................... 438/257; 438/266
(58) Field of Search .......................... 438/248, 257, 438/261, 266, 283, 284, 296

(56) References Cited

U.S. PATENT DOCUMENTS 5,972,752 A * 10/1999 Hong

* cited by examiner

Primary Examiner—David Nelms
Assistant Examiner—Phuc T. Dang
(74) Attorney, Agent, or Firm—Merchant & Gould P.C.

(57) ABSTRACT

A method for fabricating split gate flash memory cell. The method includes sequentially forming conductive layers and insulating layers on a semiconductor substrate, followed by forming a first opening in the conductive layers and the insulating layers. Next, a shallow trench isolation is defined in the first opening and an insulating layer is defined simultaneously in the active area within the shallow trench isolation to form a first gate isolation layer. Then, a conductive sidewall layer is formed on the sidewalls of the first gate insulating layer. The first gate insulating layer and the conductive sidewall layer are used as a hard mask to remove the conductive layer not covered by the hard mask, thus forming a floating gate comprised of the conductive sidewall layer and the conductive layer underneath. A second gate insulating layer, control gate and source/drain are then formed conventionally.

25 Claims, 14 Drawing Sheets

METHOD FOR FABRICATING SPLIT GATE FLASH MEMORY CELL

BACKGROUND OF THE INVENTION

1. Field of the Invention

The present invention relates to a method for fabricating a split gate flash memory. In particular, the invention involves the formation of a memory cell for split gate flash memory.

2. Description of the Prior Art

Complementary metal oxide semiconductor (CMOS) memory is generally categorized into two groups: random access memory (RAM) and read only memory (ROM). RAM is a volatile memory, wherein the stored data disappears when power is off. On the contrary, turning off power does not affect the stored data in a ROM.

In the past few years, market share of ROM has been continuously expanding, and the type attracting the most attention has been flash memory. The fact that a single memory cell is electrically programmable and multiple memory cell blocks are electrically erasable allows flexible and convenient application that are superior to electrically programmable read only memory (EPROM), electrically erasable programmable read only memory (EEPROM) and programmable read only memory (PROM). Furthermore, fabricating flash memory is cost effective. Having the above advantages, flash memory has been widely applied in consumer electronic products, such as digital cameras, digital video cameras, mobile phones, notebooks, personal stereos and personal digital assistant (PDA).

Since portability of these electrical consumer products is strongly prioritized by consumers, the size of the products must be minimal. As a result, capacity of flash memory must increase, and functions must be maximized while sizes thereof are continuously minimized. Having an increased amount of access data, capacity of memory cells has been enhanced from 4 to 256 MB, and even 1 G byte will become the market trend in the near future. Masks are essential in conventional processes for fabricating flash memory, even for the most critical process of floating gate and control gate.

Figure 1A:
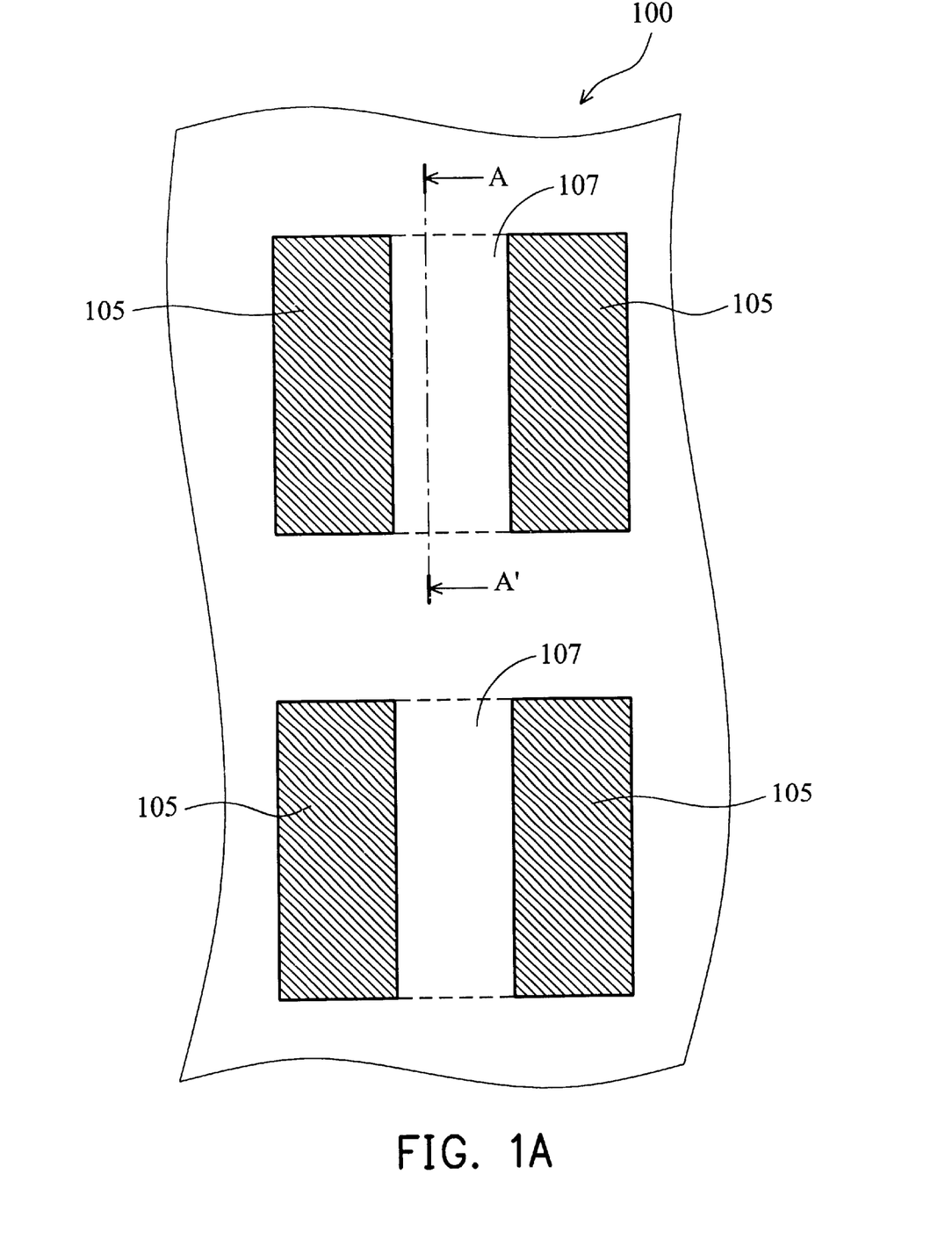
FIGS. 1A–1H are schematic cross-sections of a partially fabricated integrated circuit structure at successive stages of forming a memory cell of a split gate flash memory according to a conventional process.

Conventional process for a split gate flash memory cell is further explained with references to FIGS. 1A–1F. In FIG. 1A, a p-type silicon substrate 100 is thermal oxidized by local oxidation (LOCOS) to form a field isolation region 105. An active area 107 is then formed by separating the field isolation region.

Figure 1B:
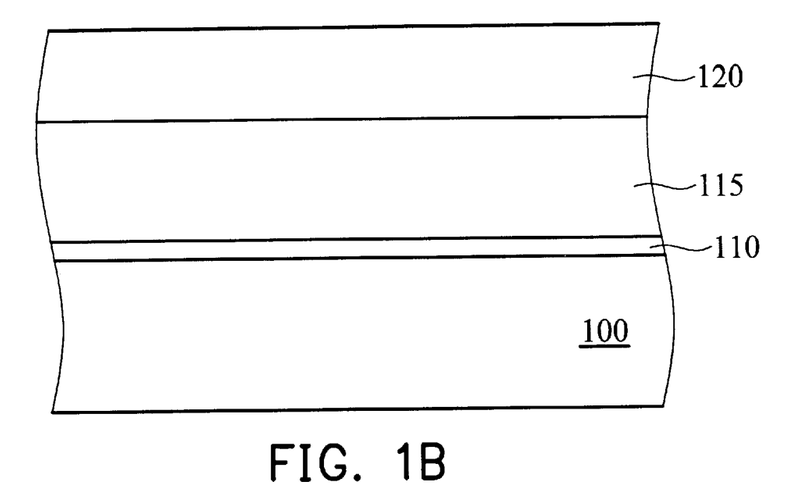

FIG. 1B is a cross-section of the line A–A' in FIG. 1A, where a first insulating layer 110 is formed by silicon oxide on the surface of the substrate 100 within the active area 107. Then, a polysilicon layer is formed by chemical vapor deposition (CVD) on the first insulating layer 110, followed by doping a suitable amount of dopant to form a first conductive layer 115. Silicon nitride is then deposited on the surface of the first conductive layer 115 to form a first masking layer 120 as a hard mask.

Figure 1C:
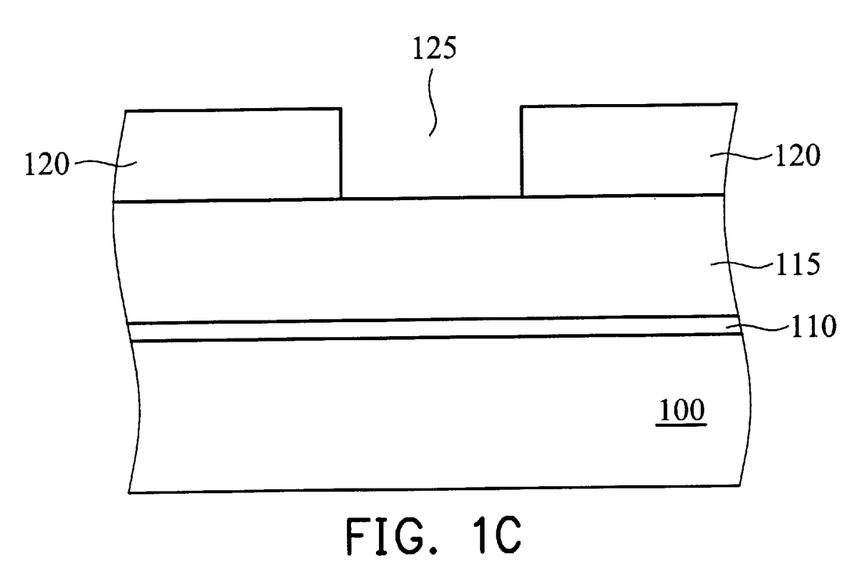

In FIG. 1C, part of the first masking layer 120 is removed to define a first opening 125 and expose the surface of the first conductive layer 115.

Figure 1D:
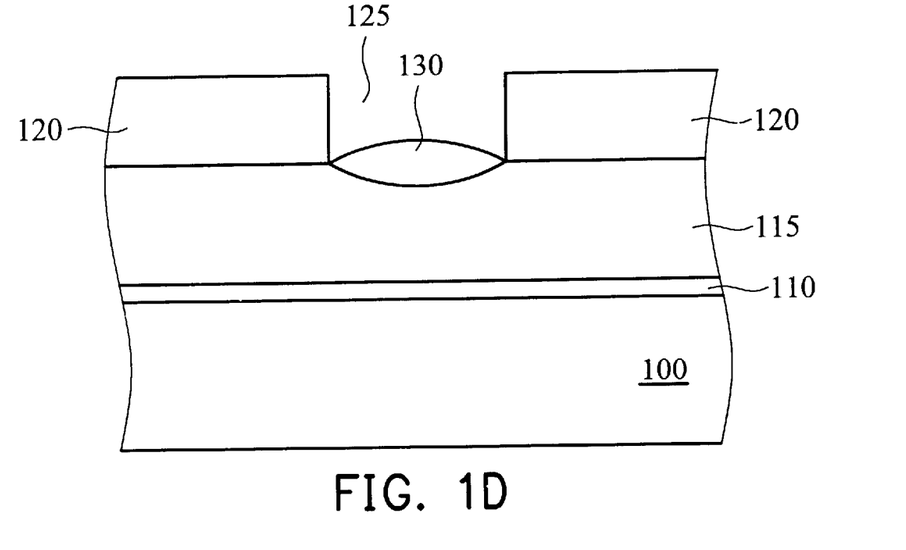

Next, oxidation is performed to form a floating gate oxide layer 130 on the exposed first conductive layer 115, as shown in FIG. 1D.

Figure 1E:
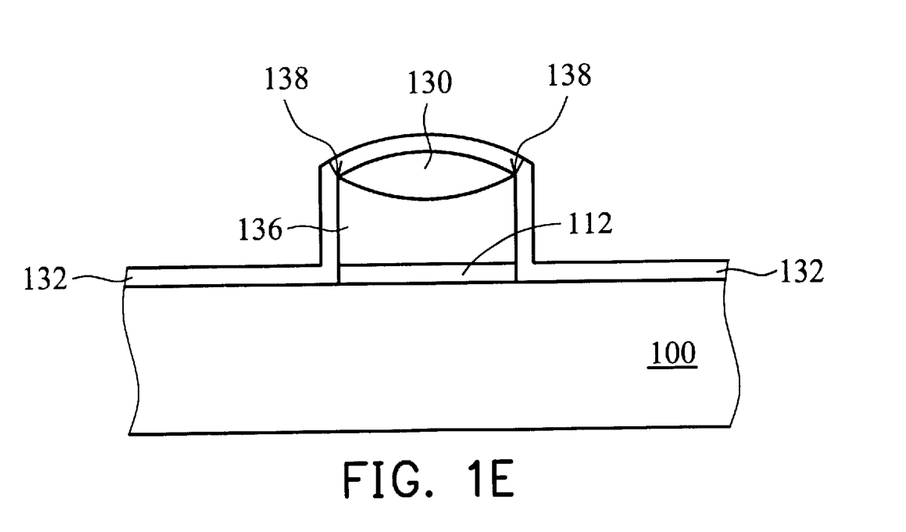

Then, in FIG. 1E, the first masking layer 120 is removed by isotropic etching, followed by using the floating gate oxide layer 130 as a hard mask to perform anisotropic etching. In this step, part of the first conductive layer 115 and the first isolating layer 110 are sequentially removed. The first conductive layer 115 and the first insulating layer 110 located underneath the floating gate oxide layer 130 remain, while the surface of substrate 100 is exposed. The remaining first conductive layer 115 becomes a floating gate 136, and the remaining first insulating layer 110 becomes a first gate insulating layer 112. Conductive tip 138, formed when forming the floating gate 136, discharges the floating gate 136 when data is being erased in the flash memory. Next, oxidation or CVD is performed to form a second insulating layer 132 using silicon oxide, to cover the substrate 100, surface of the floating gate oxide layer 130, and sidewalls of the floating gate 136 and the first gate insulating layer 112.

Figure 1F:
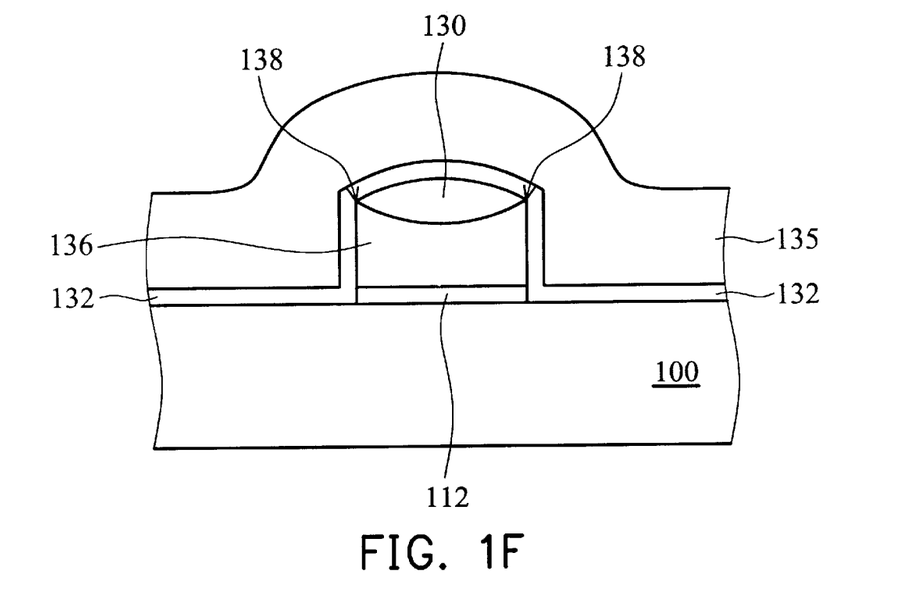

A second conductive layer 135 is then formed by doped polysilicon, to cover the surface of the second insulating layer 132, as shown in FIG. 1F.

Figure 1G:
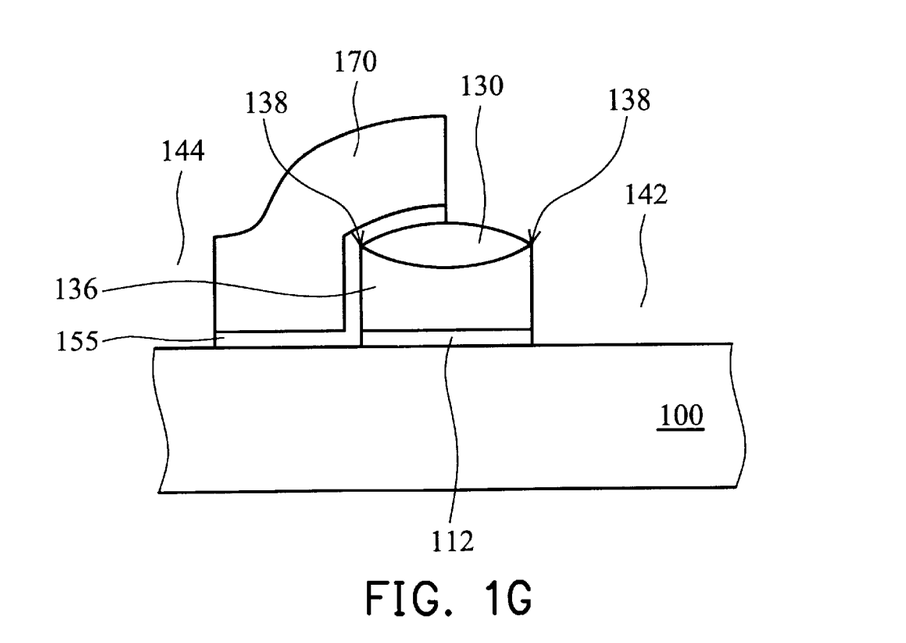

Then, in FIG. 1G, photolithography and etching are performed to remove part of the second conductive layer 135 and the second insulating layer 132 to form a second opening 142 and a third opening 144. The remaining second conductive layer 135 becomes a control gate 170, and the remaining second insulating layer 132 becomes the second gate insulating layer 155.

Figure 1H:
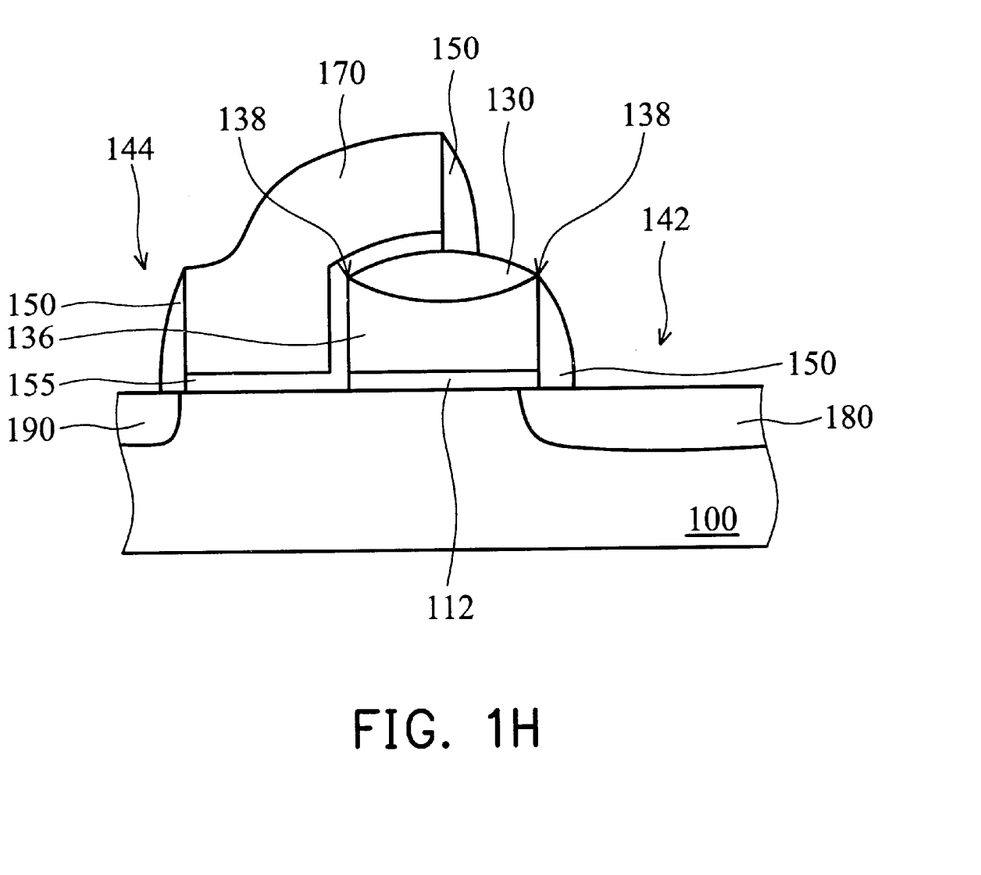

In FIG. 1H, N-type dopant, such as Phosphorous ions or Arsenic ions are doped into the substrate 100 to form a source region 180 within the second opening 142 in the substrate 100. Next, an oxide layer (not shown) is then deposited to cover the surface and sidewalls of the control gate 170, sidewalls of the second gate insulating layer 155, surface of the floating gate oxide layer 130, the floating gate 136 and sidewalls of the first gate insulating layer 112. Etching is then performed to remove part of the oxide layer to form insulating sidewall layers 150 on the sidewalls of the second opening 142 and the third opening 144. Then, N-type dopant, such as Phosphorous ions or Arsenic ions are doped into the substrate 100 to form a drain region 190 within the third opening 144 in the substrate 100. This completes the conventional process for fabricating a split gate flash memory cell.

Conventionally, a floating gate oxide layer is firstly formed on the conductive layer of doped polysilicon. Next, anisotropic etching is performed to remove the conductive layer of doped polysilicon not covered by the floating gate oxide layer. Hence, the conductive layer of doped polysilicon underneath the floating gate oxide forms the floating gate. However, sizes of all elements must be decreased when integration of memory cell rapidly increases. Due to the fact that the floating gate insulating layer is formed by oxidation in conventional processes, accuracy cannot meet the requirements of highly-integrated memory cells.

SUMMARY OF THE INVENTION

In order to overcome the above problems, major features of the invention are as follows:

(1) Floating gate and floating gate insulating layer are formed by self-alignment: a conductive layer and an insulating layer are firstly formed on a substrate, followed by simultaneously forming a shallow trench isolation (STI) and defining the insulating layer in the active area to form a first gate insulating layer (commonly referred as floating gate insulating layer). A conductive sidewall layer is then formed on the first gate insulating layer, followed by using the first gate insulating layer and the conductive sidewall layer as a hard masks to remove the conductive layer not covered by the hard mask. A floating gate is then formed by the conductive sidewall layer and the conductive layer underneath. Since the floating gate is formed by self-alignment, size and process are easy to control without influence of line width. In addition, floating gate can be accurately formed in the active area in the shallow trench isolation (STI). However, misalignment frequently occurs in conventional process when forming a floating gate in the shallow isolation trench (STI). Consequently, a floating gate is not formed in the predetermined accurate position in the active area, and gaps are formed between floating gate and shallow trench isolation. It can be even more serious at later stages when implanting ions to form source/drain regions, where leakage path occurs in the gaps between floating gate and the shallow trench isolation. As a result, data stored in the floating gate disappears, thus the function of flash memory is lost. The floating gate cannot be programmed nor erased. Besides, it cannot gate the channel.

(2) Anisotropic etching is used to form the conductive sidewall layer to ensure the formation of a more shaped conductive tip than is conventionally made and an easier controlled process.

(3) Floating gate and shallow trench isolation (STI) are simultaneously formed by simpler process.

According to the key points listed above, a method for fabricating a split gate flash memory cell is provided in this invention, comprising the following steps: providing a substrate; forming an oxide layer on the substrate; forming a first conductive layer on the oxide layer; forming a first insulating layer on the first conductive layer; forming a second insulating layer on the first insulating layer; forming a first opening by removing part of the second insulating layer, the first insulating layer, the first conductive layer, oxide layer and substrate, thereby defining the position of the field isolation region, wherein an active area is located between neighboring field isolation regions; forming a third insulating layer to cover the remaining second insulating layer and extending into the first opening to cover the sidewalls and bottom of the first opening; forming a fourth insulating layer to cover the third insulating layer and fill the first opening; removing sequentially the remaining fourth insulating layer and third insulating layer on the surface of the second insulating layer, only keeping the part within the first opening; leaving part of the remaining fourth insulating layer in the first opening to form a second opening, wherein the remaining fourth insulating layer is shallow trench isolation; forming a fifth insulating layer to fill the second opening; defining a gate region by photolithography and etching, followed by removing the remaining second insulating layer and first insulating layer outside the gate region to expose the surface of the remaining first conductive layer, wherein the remaining first insulating layer in the gate region is the first gate insulating layer, and part of the third insulating layer and fifth insulating layer are removed simultaneously when removing the second insulating layer in this step, the removed thickness is the same as that of the second insulating layer; forming a second conductive layer to cover the sidewalls of the first gate insulating layer, surface and sidewalls of the second insulating layer in the gate region and the surfaces of the first conductive layer and the fifth insulating layer, and the surface and sidewalls of the third insulating layer outside the gate region; removing the first conductive layer, surface of the fifth insulating layer, and surface and sidewalls of the third insulating layer not covering the gate region, part of second conductive layer covering the surface and sidewalls of the remaining second isolating layer inside the gate region, to form a conductive sidewall layer on the sidewall of the first gate insulating layer, which is the tip of polysilicon; using the remaining second insulating layer, first gate insulating layer and the conductive tip as a hard mask to remove the first conductive layer and oxide layer not covered by the remaining second insulating layer, first gate insulating layer and conductive tip, and the remaining first conductive layer and conductive tip are combined to form a floating gate, and the remaining oxide is a gate oxide layer; removing the remaining fifth insulating layer, second insulating layer and part of the remaining third insulating layer to expose the surface of the shallow trench isolating and the first gate insulating layers; forming a sixth insulating layer to cover the substrate and surface of the shallow trench isolation, surface and sidewalls of the third insulating layer, the gate oxide layer, the floating gate, sidewalls of the conductive tip and upper surface of the first gate insulating layer; forming a third conductive layer to cover the surface of the sixth insulating layer; sequentially removing part of the third conductive layer and the sixth insulating layer to form a third opening and a fourth opening, and the remaining third conductive layer forms a control gate and the remaining sixth insulating layer form a second gate insulating layer; forming a source region on the substrate within the third opening; forming a insulating sidewall layer on the sidewalls of the third opening and the fourth opening; and forming a drain region on the substrate within the fourth opening.

DETAILED DESCRIPTION OF THE INVENTION

The invention disclosed herein is directed to a method of fabricating the memory cell of flash memory. The drawings show a partially completed integrated circuit device. In the following description, details are set forth in order to provide a thorough understanding of the present invention. It will be appreciated by those skilled in the art that variations of these specific details are possible while still achieving the results of the present invention. Well-known process steps are not described in detail in order to avoid unnecessarily obscuring the present invention. The present invention will become more fully understood from the detailed description given hereinbelow and the accompanying drawings, given by way of illustration only and thus not intended to be limitative of the present invention.

Figure 2A:
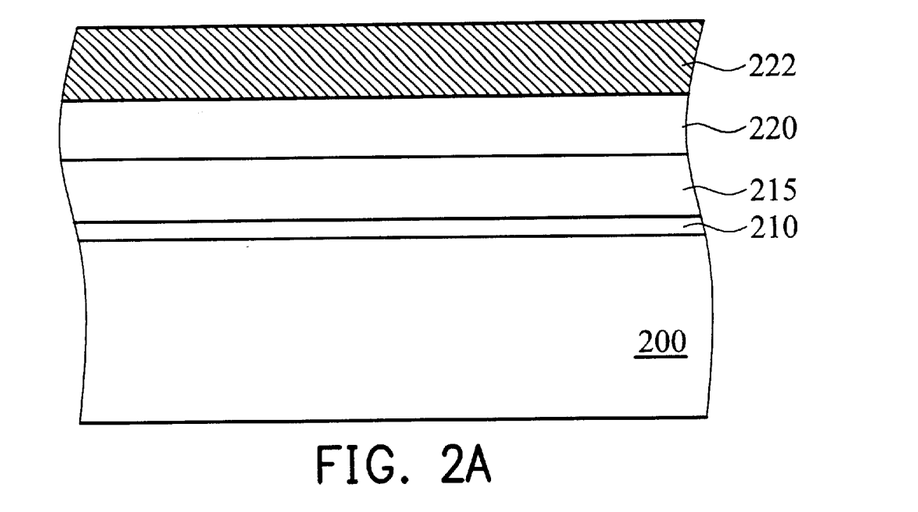
FIGS. 2A–2P are schematic cross-sections of a partially fabricated integrated circuit structure at successive stages of forming a memory cell of a split gate flash memory according to an embodiment of the present invention.

As shown in FIG. 2A, a semiconductor substrate 200, such as Si or Ge is provided. It can be epitaxial silicon or silicon on insulator (SOI). In a p-type Si substrate for example, an oxide layer 210 is formed on the substrate 200. Thickness of the oxide layer 210 is 50~200 Å and is silicon oxide formed by oxidation. Next, a first conductive layer 215, having a thickness of 500~2000 Å, is formed on the oxide layer 210. The first conductive layer 215 is polysilicon formed by chemical vapor deposition (CVD). In order to give the conductive layer conductivity, Arsenic ions or Phosphorus ions are doped, implanted, or in-situ doped into the polysilicon. Then, a first insulating layer 220 is formed on the first conductive layer 215 by low pressure CVD (LPCVD) or thermal oxidation. It is silicon oxide and has a thickness of 500~2000 Å. Next, a second insulating layer 222, silicon nitride, is formed by LPCVD on the first insulating layer 220 with a thickness of 500~2000 Å.

Figure 2B:
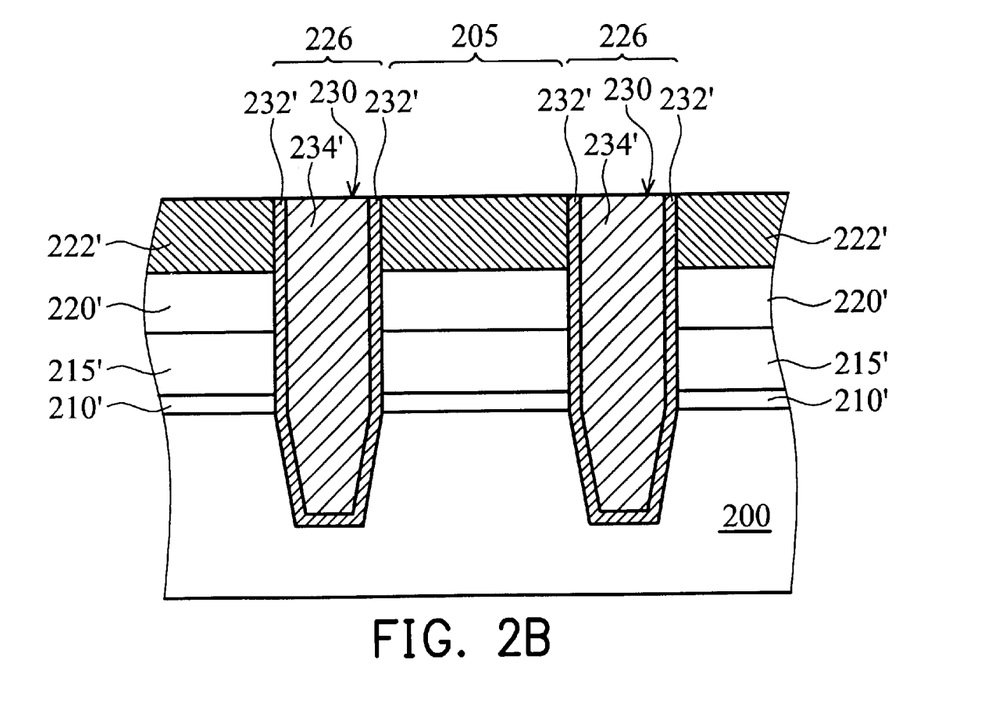

In FIG. 2B, photolithography and etching are performed to remove part of the second insulating layer 222, the first insulating layer 220, the first conductive layer 215, oxide layer 210 and substrate 200 to form a first opening 230 to define the position of a field isolation region 226. The area between two neighboring field isolation regions forms an active area 205. The remaining second isolation layer 222, first insulating layer 220, first conductive layer 215, and oxide layer 210 are now represented by remaining second insulating layer 222', remaining first insulating layer 220', remaining first conductive layer 215', and remaining oxide layer 210'. Next, a third insulating layer 232 (not shown) is formed to cover the surface of the remaining second insulating layer 222' and extend to inner sides of the first opening 230 to cover sidewalls and bottom of the first opening 230. Material used for the third insulating layer 232 can be the same as that for the second insulating layer 222, such as silicon nitride formed by low pressure chemical vapor deposition (LPCVD). Thickness is 100~200 Å. Next, a fourth insulating layer 234 (now shown) is formed to cover the surface of the third insulating layer 232 and fill the first opening 230. The fourth insulating layer 234 is formed by chemical vapor deposition (CVD) using silicon oxide with a thickness of 4000~5000 Å. A planarization is then performed to sequentially remove the fourth insulating layer 234 and the third insulating layer 232 on the surface of the remaining second insulating layer 222' and only keep the part within the first opening 230. It is carried out by chemical mechanical polishing (CMP). The remaining third insulating layer 232 and fourth insulating layer 234 are now represented by 232' and 234'.

Figure 2C:
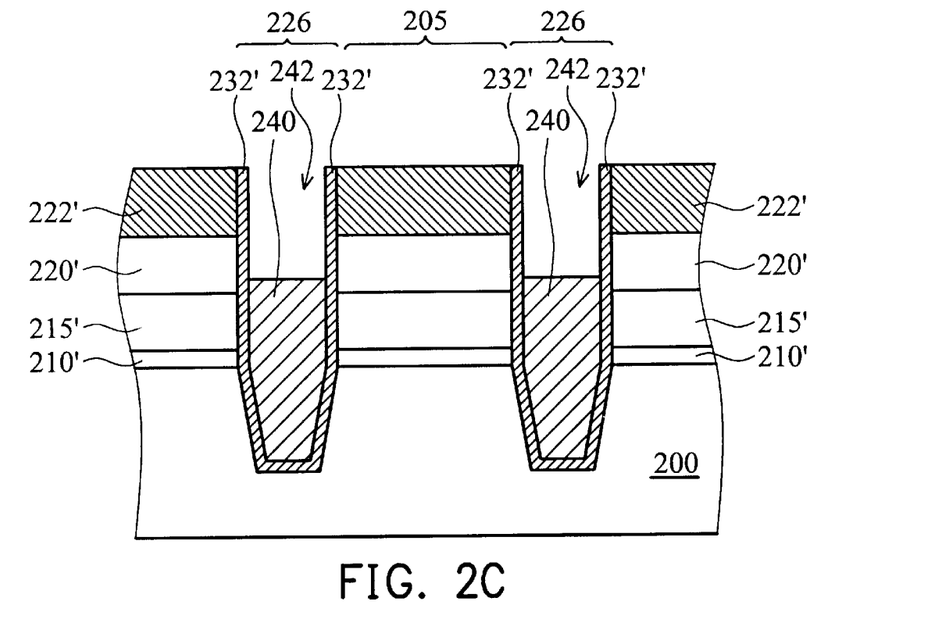

In FIG. 2C, etching is performed to remove part of the remaining fourth insulating layer 234' in the first opening 230 to form a second opening 242. In this step, etching is isotropic etching. The remaining fourth insulating layer 234' is represented by shallow trench isolation 240.

Figure 2D:
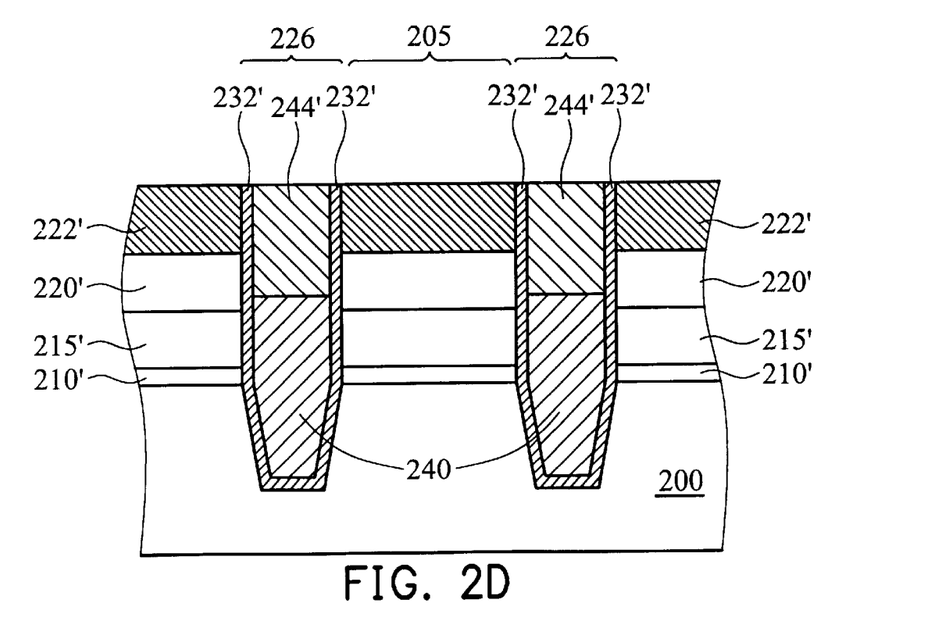

In FIG. 2D, a fifth insulating layer 244 (not shown) is formed on the surface of the remaining second insulating layer 222' and fills the second opening 242. The fifth insulating layer 244 can be the same as the second insulating layer 222, such as silicon nitride formed by low pressure chemical vapor deposition (LPCVD), with a thickness of 1000~3000 Å. Next, planarization is performed to remove the fifth insulating layer 244 on the surface of the remaining second insulating layer 222' and keep the part within the second opening 242. This planarization is performed by chemical mechanical polishing (CMP). The remaining fifth insulating layer 244 is represented by the remaining fifth insulating layer 244'.

Figure 2E:
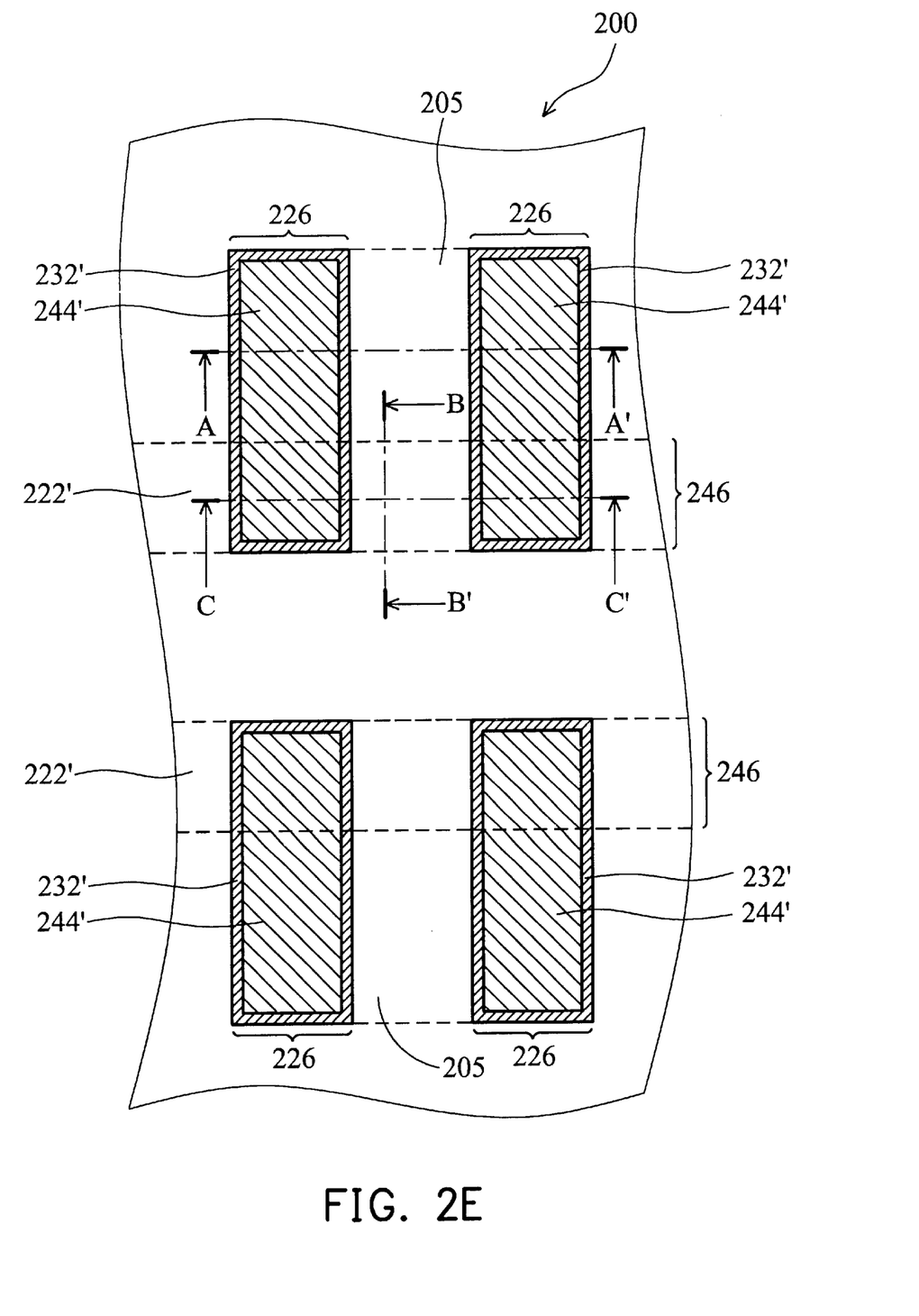

In FIG. 2E, which is a top view of the flash memory completed in FIG. 2D, relative positions of field isolation region 226, active area 205 and gate region 246 formed at later stage are shown. FIGS. 2A~2D are cross-section of the flash memory at line A–A' in FIG. 2E. After FIG. 2D, photolithography and etching are performed to define a gate region 246. The gate area 246 is kept to form the gate at a later stage, while the rest of the remaining second insulating layer 222' and remaining first insulating layer 220' are removed by isotropic etching to expose the surface of the remaining first conductive layer 215'. At the same time, since the third insulating layer 232' and the fifth insulating layer 244' are the same material as the second insulating layer 222', when the remaining second insulating layer 222' is removed, the third insulating layer 232' and the fifth insulating layer 244' in the second opening 242 are removed as well. The removed thickness is the same as that of the remaining second insulating layer 222'.

In order to clearly illustrate the detailed follow-up process, the following figures are drawn according to the line A–A', B–B' and C–C' in FIG. 2E.

Figure 2F:
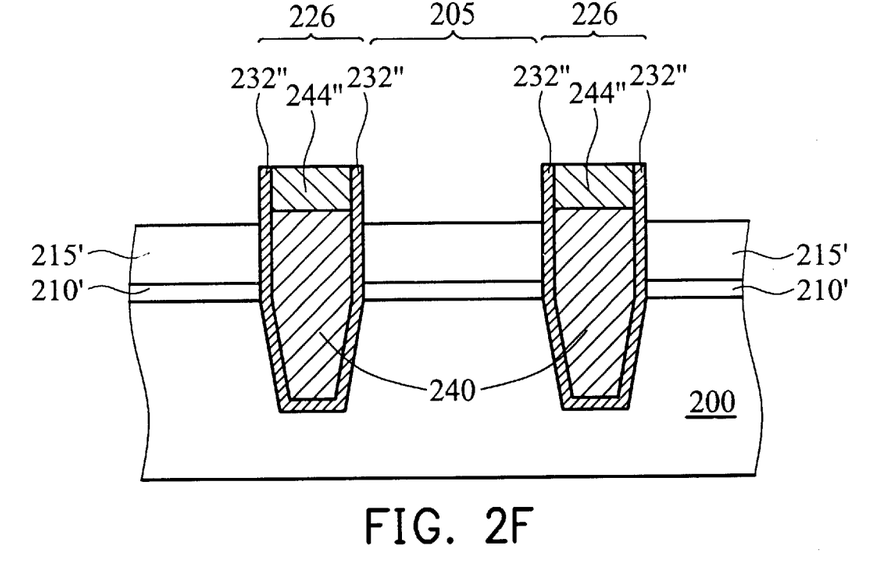

FIG. 2F is a cross-section of line A–A' in FIG. 2E. The remaining third insulating layer 232' and fifth insulating layer 244' are now represented by the remaining third insulating layer 232" and the remaining fifth insulating layer 244".

Figure 2G:
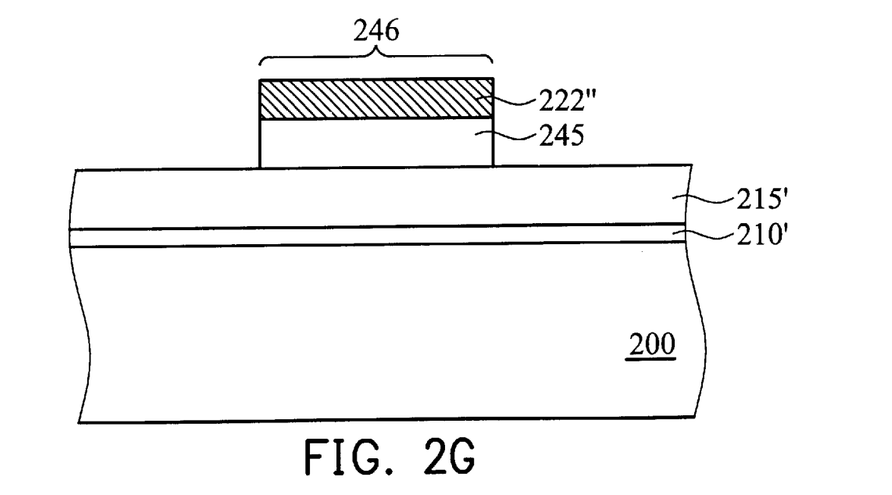

FIG. 2G is a cross-section of line B–B' in FIG. 2E. In FIG. 2E, the remaining first insulating layer 220' and remaining second insulating layer 222' outside the gate region 246 are removed to expose the surface of the first conductive layer 215. In the gate region 246, the remaining first insulating layer 220' and the remaining second insulating layer 222' are represented by first gate insulating layer 245 and the remaining second insulating layer 222".

Figure 2H:
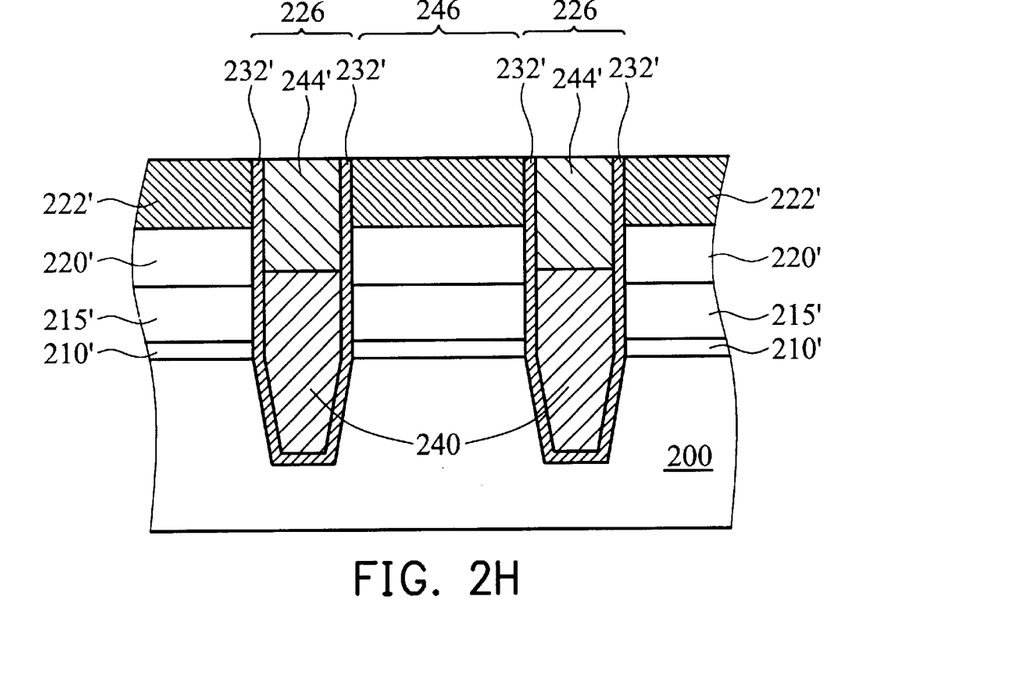

FIG. 2H is a cross-section of line C–C' in FIG. 2E. The remaining second insulating layer 222', the remaining first insulating layer 220' and the remaining fifth insulating layer 244' are kept.

Figure 2I:
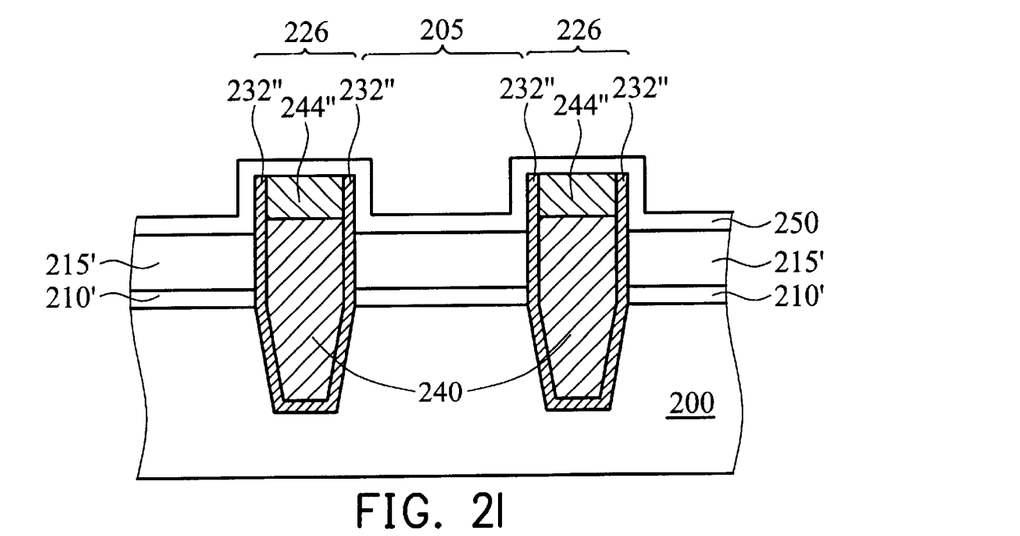

FIG. 2I, is a cross-section of line A–A' in FIG. 2E after FIG. 2F. A second conductive layer 250 is formed to fully cover the surface of the remaining first conductive layer 215'. In this figure, the second conductive layer 250 covers the remaining first conductive layer 215' and surface of the remaining fifth insulating layer 244", and surface and sidewalls of the remaining third insulating layer 232". Thickness of the second conductive layer 250 is 50~200 Å. It is polysilicon formed by chemical vapor deposition. In order to become conductive, Arsenic ions or Phosphorous ions can be diffused, implanted or in-situ doped to form doped polysilicon.

Figure 2J:
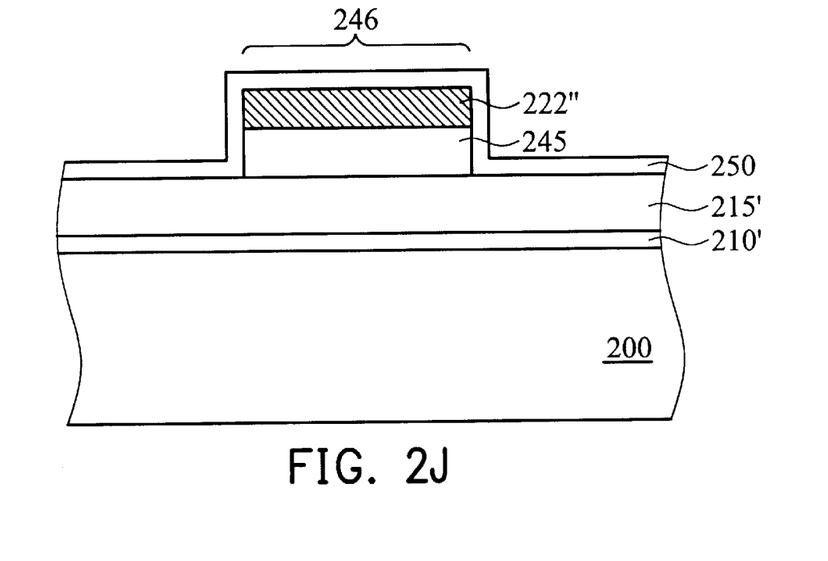

FIG. 2J is a cross-section of line B–B' in FIG. 2E. After steps in FIG. 2G, the second conductive layer 250 formed in FIG. 2I covers surface of the remaining first conductive layer 215', sidewalls of the first gate insulating layer 245 within the gate region 246 and surface and sidewalls of the remaining second insulating layer 222".

Figure 2K:
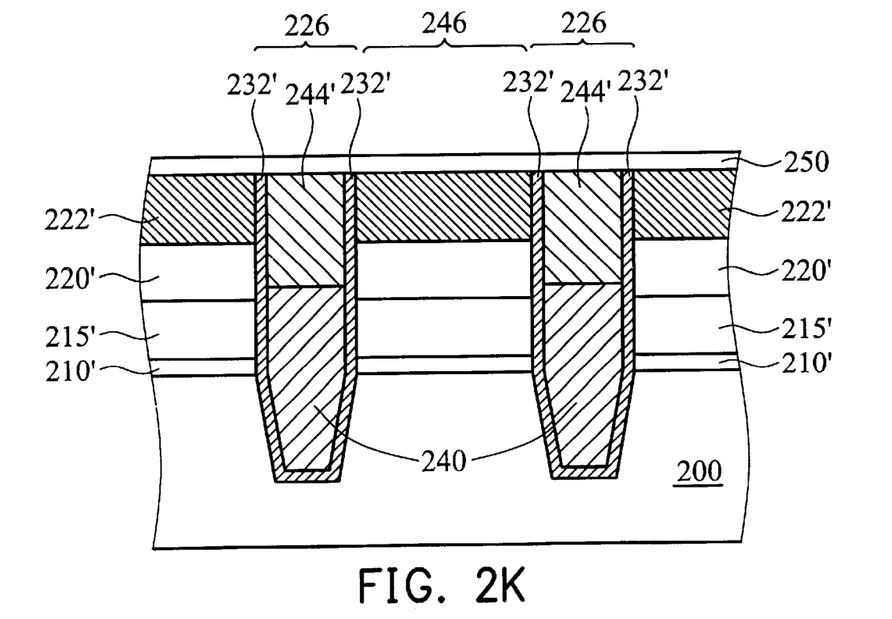

FIG. 2K is a cross-section of line C–C' in FIG. 2E. After FIG. 2H, the second conductive layer 250 formed in FIG. 2I covers surfaces of the remaining second insulating layer 222', the remaining third insulating layer 232' and the remaining fifth insulating layer 244' within the gate region 246.

Figure 2L:
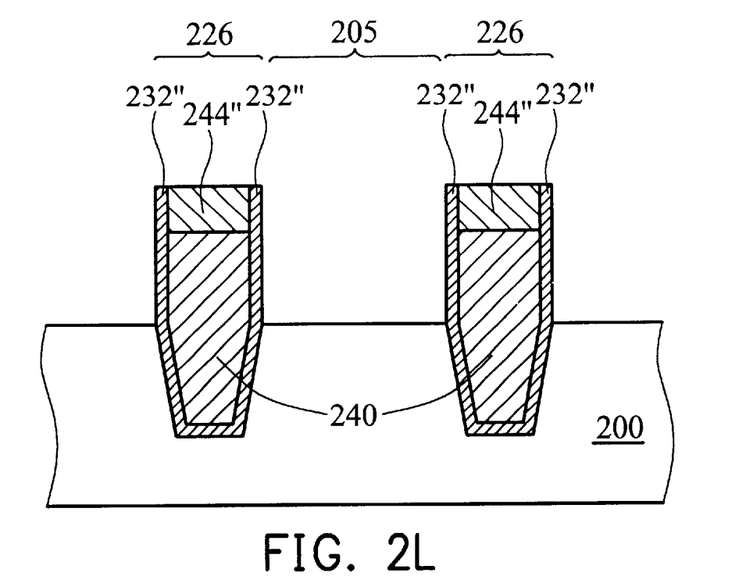

FIG. 2L is a cross-section of line A–A' in FIG. 2E. After FIG. 2I, etching is performed to remove the second conductive layer 250, the first conductive layer 215 and oxide layer 210 outside the gate region 246. Sidewalls of the third insulating layer 232" and surface of the substrate are consequently exposed. Etching in this step is anisotropic.

Figure 2M:
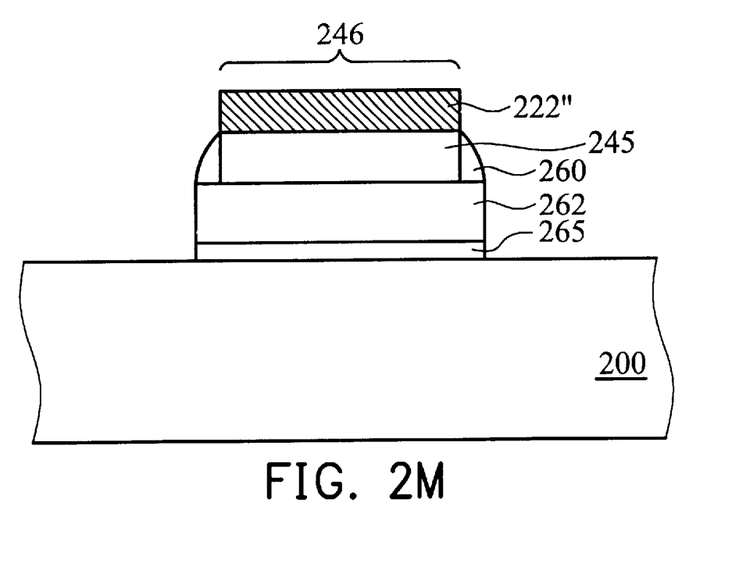

FIG. 2M is a cross-section of line B–B' in FIG. 2E. After FIG. 2J, and etching is performed in FIG. 2L, the second conductive layer 250 that covers the surface and sidewalls of the remaining second insulating layer 222', and surface of the first conductive layer 215' is removed. Next, part of the second conductive layer 250 that covers the first gate insulating layer 245 is removed to form a conductive sidewall layer, which is the conductive tip 260. Etching in this step is anisotropic. Next, the remaining second insulating layer 222", the first gate insulating layer 245 and conductive tip 260 are used as a hard mask etching as performed in FIG. 2L is performed to remove the first conductive layer 215 and oxide layer 210 that are not covered by the remaining second insulating layer 222", first gate insulating layer 245 and conductive tip 260. The remaining first conductive layer 215 and conductive tip 260 together form a floating gate 262. The remaining oxide layer 210 is the gate oxide layer 265. Etching in this step is anisotropic.

Figure 2N:
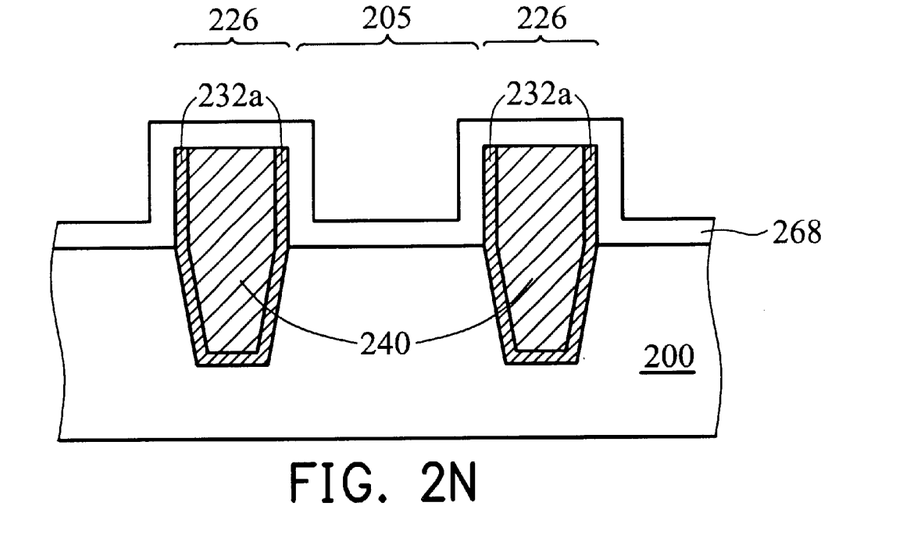

FIG. 2N shows the step after FIG. 2L. Etching is performed to remove the remaining fifth insulating layer 244" and a portion of the remaining third insulating layer 232" to expose the surface of the shallow trench isolation 240. The remaining third insulating layer 232" is represented by the remaining third insulating layer 232a. Next, silicon oxide is used to form a sixth insulating layer 268, with a thickness of 100~200 Å to cover the surface of the substrate 200, surface and sidewalls of the remaining third insulating layer 232a and surface of shallow trench isolation 240. It is formed by CVD or thermal oxidation.

Figure 2O:
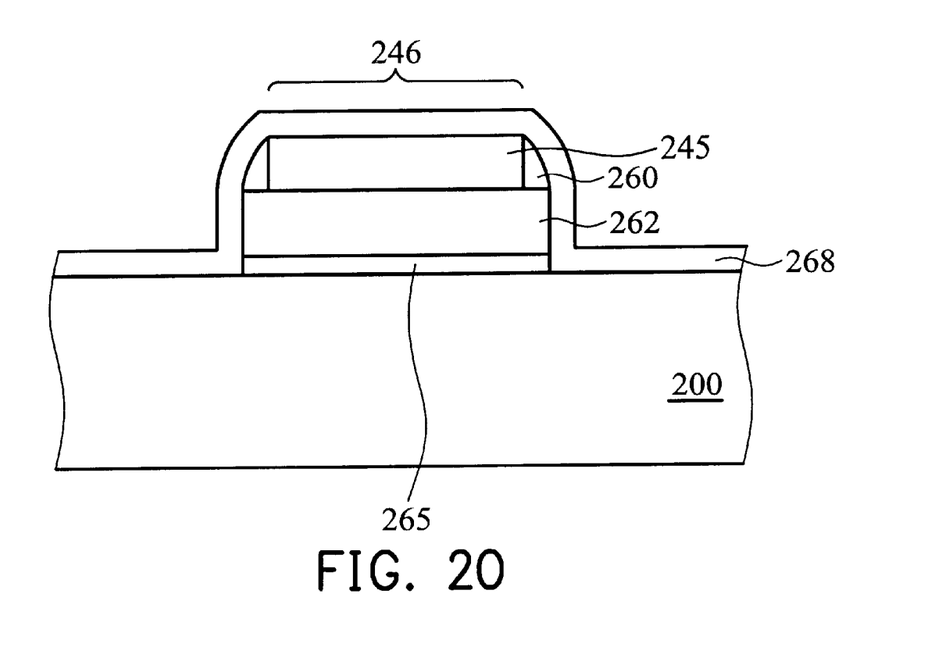

FIG. 2O is a cross-section of line B–B' in FIG. 2E. After FIG. 2L, etching is performed in FIG. 2N to remove the remaining second insulating layer 222" to expose the surface of the first gate insulating layer 245. Next, a sixth insulating layer 268 is formed in FIG. 2P to cover the surface of the substrate 200, sidewalls of gate oxide layer 265, floating gate 262 and conductive tip 260 and upper surface of the first gate insulating layer 245.

Figure 2P:
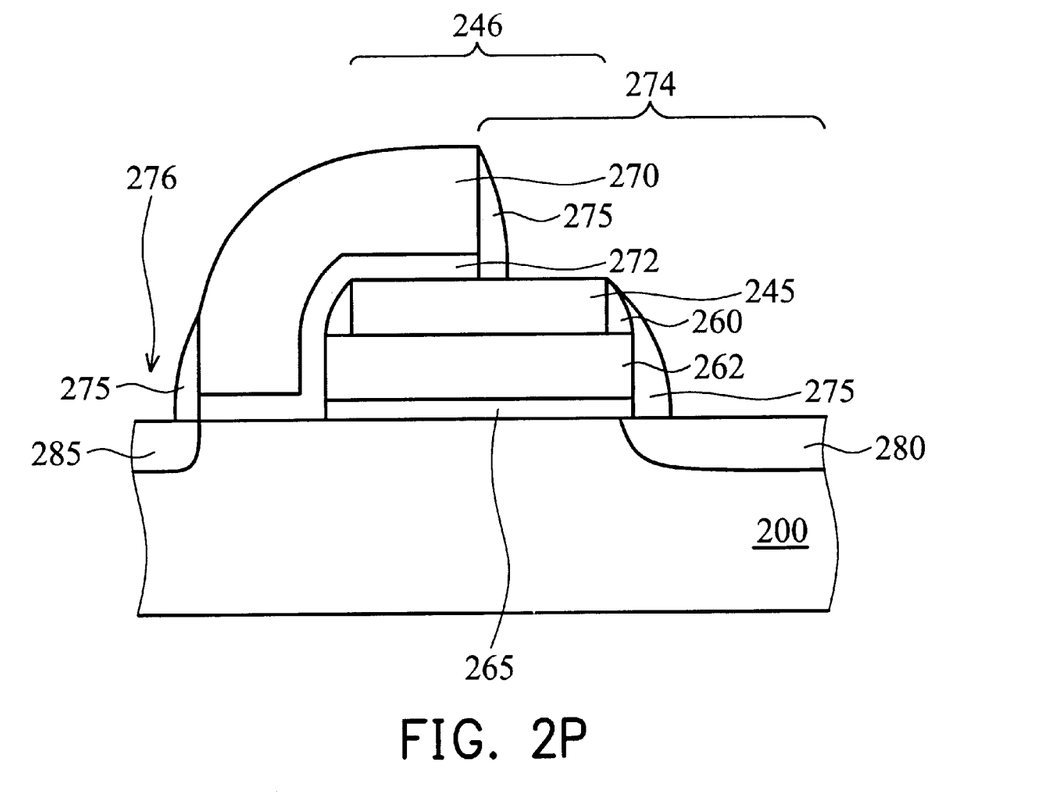

FIG. 2P, which follows FIG. 2O, shows a third conductive layer (not shown) is formed to cover the surface of the sixth insulating layer 268. It is doped polysilicon formed by depositing a polysilicon layer, with a thickness of 5000~10000 Å, by CVD, followed by diffusion or ion implantation of Arsenic ions or Phosphorous ions. Alternatively, in-situ doping can be used to form the doped polysilicon as the conductive layer. Next, photolithography and etching are performed to remove part of the third conductive layer and sixth insulating layer 268. The remaining third conductive layer forms a floating gate 270, and a third opening 274 and a fourth opening 276 are formed simultaneously. Then, N type dopants, such as Arsenic or Phosphorous are implanted into the substrate 200 to form a source region 280 in the upper surface of the substrate 200 within the third opening 274. An insulation sidewall layer 275 is formed on the sidewalls of the third opening 274 and the fourth opening 276. It is silicon oxide formed by CVD, followed by anisotropic etching. Next, N type dopant, such Arsenic or Phosphorous are implanted into the substrate 200 to form a drain region 285 in the upper surface of the substrate 200 within the fourth opening 276. This concludes the fabrication process of a split gate flash memory cell.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a split gate flash memory cell, comprising:

providing a substrate;

forming an oxide layer on the substrate;

forming a first conductive layer on the oxide layer;

forming a first insulating layer on the first conductive layer;

forming a second insulating layer on the first insulating layer;

forming a first opening by removing part of the second insulating layer, the first insulating layer, the first conductive layer, oxide layer and substrate, thereby defining the position of the field isolation region, wherein active area is located between neighboring field isolation regions;

forming a third insulating layer to cover the remaining second insulating layer and extending into the first opening to cover the sidewalls and bottom of the first opening;

forming a fourth insulating layer to cover the third insulating layer and fill the first opening;

removing sequentially the remaining fourth insulating layer and third insulating layer on the surface of the second insulating layer, only maintaining the part within the first opening;

removing part of the remaining fourth insulating layer in the first opening to form a second opening, wherein the remaining fourth insulating layer forms a shallow trench isolation;

forming a fifth insulation to fill the second opening;

defining a gate region by photolithography and etching, followed by removing the remaining second insulating layer and first insulating layer not covered by the gate region to expose the surface of the remaining first conductive layer, wherein the remaining first insulating layer in the gate region is the first gate insulating layer, and part of the third insulating layer and fifth insulating layer are removed simultaneously when removing the remaining second insulating layer in this step, the removed thickness of which is the same as that of the second insulating layer;

forming a second conductive layer to cover the sidewalls of the first gate insulating layer, surface and sidewalls of the remaining second insulating layer in the gate region and the surfaces of the first conductive layer and the fifth insulating layer, and the surface and sidewalls of the third insulating layer outside the gate region;

removing the first conductive layer, surface of the fifth insulating layer, and surface and sidewalls of the third insulating layer not covered by the gate region, part of second conductive layer that covers the surface and sidewalls of the remaining second isolation layer inside the gate region, to form a conductive sidewall layer on the sidewall of the first gate insulating layer, which is the tip of polysilicon;

using the remaining second insulating layer, first gate insulating layer and the conductive tip as a hard mask to remove the first conductive layer and oxide layer not covered by the remaining second insulating layer, first gate insulating layer and conductive tip, and the remaining first conductive layer and conductive tip is combined to form a floating gate, and the remaining oxide is a gate oxide layer;

removing the remaining fifth insulating layer, second insulation layer and part of the remaining third insulating layer to expose the surface of the shallow trench isolation and the first gate insulating layer;

forming a sixth insulating layer to cover the substrate and surface of the shallow trench isolation, surface and sidewalls of the remaining third insulating layer, the gate oxide layer, the floating gate, sidewalls of the conductive tip and upper surface of the first gate insulating layer;

forming a third conductive layer to cover the surface of the sixth insulating layer;

removing sequentially part of the third conductive layer and the sixth insulating layer to form a third opening and a fourth opening, and the remaining third conductive layer forms a control gate and the remaining sixth insulating layer forms a second gate insulating layer;

forming a source region on the substrate within the third opening;

forming an insulation sidewall layer on the sidewalls of the third opening and the fourth opening; and forming a drain region on the substrate within the fourth opening.

2. The method as claimed in claim 1, wherein the substrate is silicon substrate.

3. The method as claimed in claim 1, wherein the oxide layer is formed by oxidation of silicon oxide.

4. The method as claimed in claim 1, wherein the thickness of the oxide is 50~200 Å.

5. The method as claimed in claim 1, wherein the first conductive layer is formed by doped polysilicon.

6. The method as claimed in claim 1, wherein the thickness of the first conductive layer is 500~2000 Å.

7. The method as claimed in claim 1, wherein the first insulating layer is formed by silicon oxide.

8. The method as claimed in claim 1, wherein the thickness of the first insulating layer is 500~2000 Å.

9. The method as claimed in claim 1, wherein the second insulating layer is formed by silicon oxide.

10. The method as claimed in claim 1, wherein the thickness of the second insulating layer is 500~2000 Å.

11. The method as claimed in claim 1, wherein the third insulating layer is formed by silicon nitride.

12. The method as claimed in claim 1, wherein the third insulating layer is the same material as the second insulating layer.

13. The method as claimed in claim 1, wherein the thickness of the third insulating layer is 100~200 Å.

14. The method as claimed in claim 1, wherein the fourth insulating layer is formed by silicon oxide.

15. The method as claimed in claim 1, wherein the thickness of the fourth insulating layer is 4000~5000 Å.

16. The method as claimed in claim 1, wherein the fifth insulating layer is formed by silicon nitride.

17. The method as claimed in claim 1, wherein the fifth insulating layer is the same material as the second insulating layer.

18. The method as claimed in claim 1, wherein the thickness of the fifth insulating layer is 1000~3000 Å.

19. The method as claimed in claim 1, wherein the second conductive layer is formed by doped polysilicon.

20. The method as claimed in claim 1, wherein the thickness of the second conductive layer is 50~200 Å.

21. The method as claimed in claim 1, wherein the sixth insulating layer is formed by silicon oxide.

22. The method as claimed in claim 1, wherein the thickness of the sixth insulating layer is 100~200 Å.

23. The method as claimed in claim 1, wherein the third conductive layer is formed by doped polysilicon.

24. The method as claimed in claim 1, wherein the thickness of the third conductive layer is 5000~10000 Å.

25. The method as claimed in claim 1, wherein the insulation sidewall layer is formed by silicon oxide.

* * * * *